United States Patent [19]

Neidorff

[11] Patent Number: 4,924,288

[45] Date of Patent: May 8, 1990

[54] HIGH CURRENT-GAIN PNP TRANSISTOR

[75] Inventor: Robert A. Neidorff, Bedford

[73] Assignee: Unitrode Corporation, Lexington, Mass.

[21] Appl. No.: 312,372

[22] Filed: Feb. 15, 1989

Related U.S. Application Data

[63] Continuation of Ser. No. 61,786, Jun. 11, 1987, abandoned.

[51] Int. Cl.$^5$ .............................................. H01L 23/48
[52] U.S. Cl. ....................................... 357/68; 357/52; 357/53; 357/35
[58] Field of Search .......................... 357/68, 52, 53, 35

[56] References Cited

U.S. PATENT DOCUMENTS

| | | | |
|---|---|---|---|
| 3,846,821 | 11/1974 | Nagata | 357/35 |
| 4,005,451 | 1/1977 | Martinelli et al. | 357/35 |
| 4,205,333 | 5/1980 | Yamamoto | 357/35 |

FOREIGN PATENT DOCUMENTS

| | | |
|---|---|---|
| 96671 | 7/1980 | Japan ........................ 357/35 |
| 55-96671 | 7/1980 | Japan . |
| 162864 | 12/1981 | Japan . |
| 218874 | 11/1985 | Japan ........................ 357/35 |

OTHER PUBLICATIONS

IBM Tech. Discl. Bull., vol. 19, No. 2, Jul. 1976, p. 478, Article by Jambotkar.
IBM Tech. Disclosure, "Spaced . . . Voltage", C. G. Jambotkar, vol. 19, No. 2, Jul. 1976, pp. 478-479.

*Primary Examiner*—Martin H. Edlow
*Attorney, Agent, or Firm*—Weingarten, Schurgin, Gagnebin & Hayes

[57] ABSTRACT

A high current gain high-frequency planar process PNP transistor comprising an emitter region and a surrounding annular collector. The surface of the transistor is covered with an insulative oxide layer, with an aperture to the emitter region. An overlaying metal layer is provided which substantially covers the base region between the emitter and collector. Connection to the emitter region is provided with an extension of the metal surface to the aperture. However except for this connection, the surface area above the emitter region is not covered by the metal layer. The resulting transistor provides a high-frequency PNP transistor with significantly enhanced Beta.

4 Claims, 1 Drawing Sheet

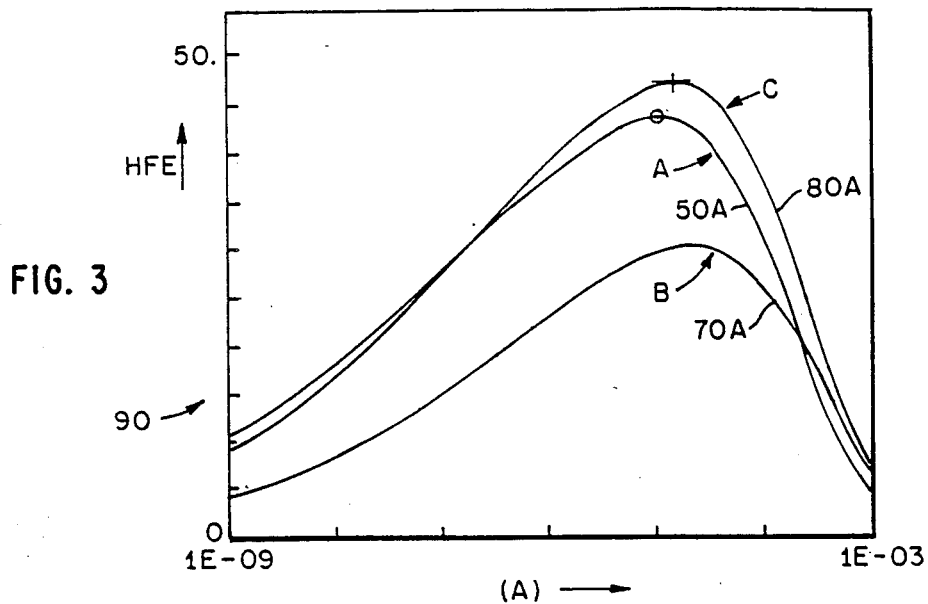
FIG. 3
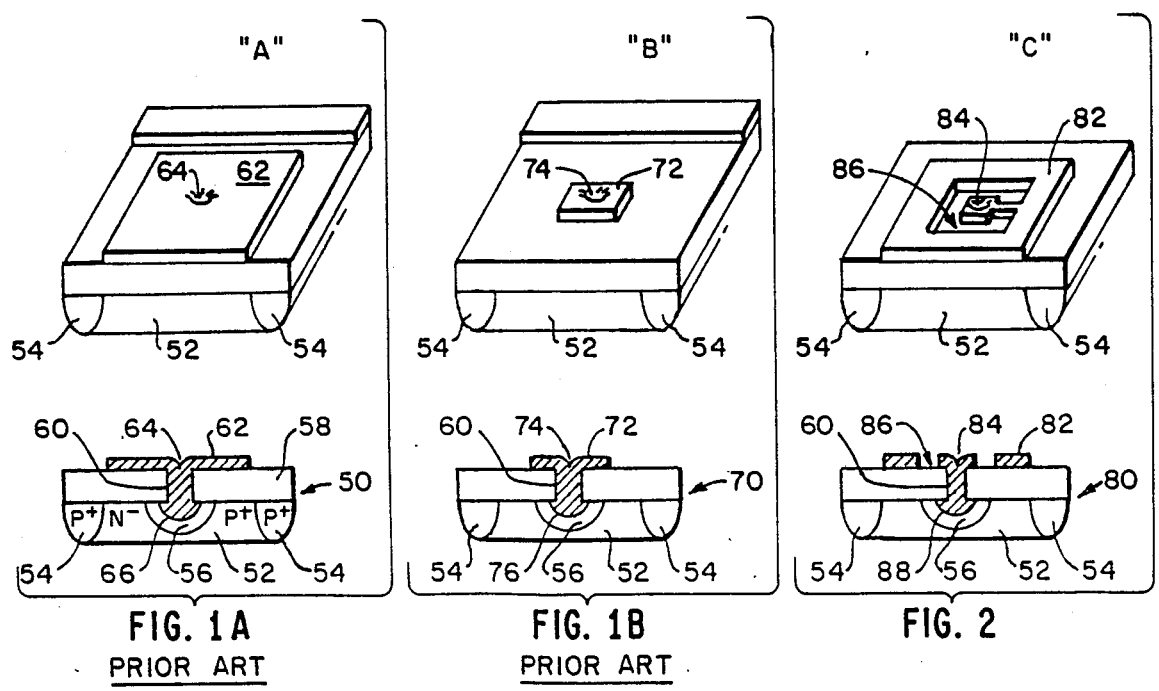
FIG. 1A
PRIOR ART
FIG. 1B
PRIOR ART
FIG. 2

HIGH CURRENT-GAIN PNP TRANSISTOR

This application is a continuation of application Ser. No. 07/061,736, filed June 11, 1987 now abandoned.

FIELD OF THE INVENTION

The present invention relates to PNP transistors, and in particular high current gain PNP planar process transistors to be implemented with integrated circuit techniques.

BACKGROUND OF THE INVENTION

The planar process monolithic integrated circuit is tailored to provide excellent NPN transistors, but also produces usable PNP transistors. The current gain (Beta) of integrated circuit PNP transistors is affected by the base oxide potential and the emitter diffusion profile. The base oxide potential can be improved by covering the base region of a PNP transistor with an emitter metal flap, or layer. However, the metal flap will also degrade the PNP Beta if the flap becomes alloyed into the emitter, thus disturbing the emitter diffusion profile. Adjustment of the emitter diffusion profile requires special processing, and is therefore rarely done in view of the added cost, complexity and detrimental effects on the normal NPN transistors.

To produce high quality PNP transistors, the emitter of the PNP transistor should be very deep in the substrate, to separate the emitter base junction within the substrate from the emitter surface contact. The contact may act as a severe crystalline defect, and provide a site for minority carrier recombination, thereby preventing the emitter minority carriers from back-injecting into the base region and acting as usable base current. Unfortunately, the emitter diffusions make slow transistors. Modern processes feature very shallow diffusions to provide high speed transistors, at the expense of the PNP transistor Beta. For example, excellent PNP transistors can be made with 5 to 7 micron P diffusions on the integrated circuit process, but modern high speed processes feature P diffusions which are typically 0.1 and 0.2 micron deep. In such cases, the metal surface (typically aluminum), proximity to the emitter base junction, degrades the PNP Beta due to alloying of the aluminum. Barrier metals such as titanium can be effective in preventing aluminum from alloying into the diffusions, but only if a thick barrier is used. However, thick barriers traditionally interfere with the aluminum-silicon contacts, so only thin barriers with minimal effect can be used.

As a result, the quality of PNP transistors in planar process integrated circuits is severely limited, so that PNP transistors having either high Beta or high switching speed transistors may be provided, but not transistors having acceptable combination of speed and current gain.

SUMMARY OF THE INVENTION

The present invention comprises a planar process PNP transistor, providing a high speed PNP transistor having relatively high Beta, typically fifty in the prototype tested. An aluminum metal layer substantially covers the base region, and connects to the emitter region through an aperture and a minimal connecting path, wherein the area above the emitter region is not covered by the metal layer. The metal layer deployed in this configuration effectively controls the base oxide potential, yet does not allow excess aluminum alloying in the emitter region. Moreover, devices made according to this structure provide better Beta than similar, although distinguishable configurations.

BRIEF DESCRIPTION OF THE DRAWING

These and other features of the present invention can be better understood by reading the following detailed description, taken together with the drawing wherein:

FIGS. 1A and 1B are perspective drawings of two alternate prior art transistor structures;

FIG. 2 is a perspective drawing of one embodiment according to the present invention; and FIG. 3 is a graphical plot of the current of various transistor implementation, including one embodiment according to the present invention.

DETAILED DESCRIPTION OF THE INVENTION

Three variations in planar process monolithic PNP integrated circuit transistors are shown in FIGS. 1A, 1B and 2. The construction shown in FIG. 1A, includes an N substrate 52 forming the base, and the P diffusions 54 forming the collector. An emitter region 56 is formed from P plus material. The transistor structure has an overlaying insulative layer 58 having an aperture 60 through which a metal surface layer 62 makes contact with the emitter region 56 at 64. The metal of layer 62, typically aluminum becomes alloyed into the emitter region to the extent shown by the boundary 66. However, the increase of aluminum alloying into the emitter region degrades the performance of the transistor 50. An alternate embodiment is shown in transistor 70 in FIG. 1B, wherein the metal layer 72 is restricted to the region immediately over the aperture 60, wherein the boundary 76 defining the extent of aluminum alloying into the emitter region 56 is limited. However, the limited metal layer 72 provides a less than optimal emitter diffusion profile.

The preferred embodiment 80 according to the present invention is shown in FIG. 2, and provides an overlying metal layer 82 which substantially covers the area above the base region 52 and is connected to the emitter region 56 with a metal layer connection comprising a small finger-like projection connecting the area immediately above the emitter region 56 at the aperture 60. As a result, the integrated circuit PNP transistor according to the present invention provides optimal base oxide potential and emitter diffusion profile, providing a more carefully limited alloying of the metal into the emitter region, as shown by boundary 88.

A graphical plot of the Beta (HFE) according to the various embodiments 50, 70 and 80 discussed above, is made with regard to various collector currents. Thus the curve 50A corresponds to the embodiment 50 shown in FIG. 1A, the curve 70A corresponds to the embodiment 70 shown in FIG. 1B and the curve 80A corresponds to the preferred embodiment according to the present invention, shown in FIG. 2. It is therefore appreciated that the preferred embodiment according to the present invention has enhanced Beta while maintaining the high speed switching characteristic necessary for most integrated circuit applications. The curve shown on the graph of FIG. 3 shows the Beta of an embodiment of the present invention comprising a 2 micron junction depth, and a 200 ohms per square (surface resistiveity) process. However, the improvements according to the present invention would be more greatly noticeable for a shallower process or a process where the aluminum layer is more alloyed into the emitter regions of the prior art embodiments of FIGS. 1A and 1B.

Modifications and substitutions of various portions of the present invention made by one skilled in the art are within the scope of the present invention, which is not to be limited except according to the claims which follow.

What is claimed is:

1. A high current gain PNP transistor
   a substrate of n− material providing a base region;
   a p+ diffusion area in said substrate providing a collector region;
   a p+ diffusion area in said substrate providing an emitter region in selected proximity to said collector region;
   an insulative material overlaying said substrate having an aperture providing access to said emitter region, wherein said aperture comprises a lesser cross sectional area than said emitter region providing conductive access to a contact portion of said emitter; and
   a metal surface layer having a first portion substantially completely overlaying said base region between said emitter and said collector, and a second portion providing electrical connection to said contact portion of said emitter through said aperture and having an area confronting said emitter substantially less than the corresponding confronting area of said emitter region, wherein alloying of the metal surface layer through said aperture into said emitter region is minimized.

2. The high current gain PNP transistor of claim 1 wherein said substrate comprises a portion of an integrated circuit.

3. The high current gain PNP of claim 2, comprising a lateral transistor.

4. The high current gain PNP of claim 1, wherein said first portion of said metal surface layer overlaying said base region substantially surrounds said second portion of said metal surface layer providing electrical connection to said emitter.

* * * * *

UNITED STATES PATENT AND TRADEMARK OFFICE
CERTIFICATE OF CORRECTION

PATENT NO. : 4,924,288

DATED : May 8, 1990

INVENTOR(S) : Robert A. Neidorff

It is certified that error appears in the above-identified patent and that said Letters Patent is hereby corrected as shown below:

ON TITLE PAGE:

In the identification line [75], after Inventor:, "Robert A. Neidorff, Bedford", should read --Robert A. Neidorff, Bedford, New Hampshire.

In Column 2, line 67, "resistiveity" should read --resistivity--.

Signed and Sealed this

Twenty-first Day of July, 1992

Attest:

DOUGLAS B. COMER

*Attesting Officer*    *Acting Commissioner of Patents and Trademarks*